(12) United States Patent
Baier

(10) Patent No.: US 7,932,481 B2
(45) Date of Patent: Apr. 26, 2011

(54) OPERATING DEVICE, ELECTRICAL APPLIANCE WITH SUCH AN OPERATING DEVICE, ARRANGEMENT OF A GLASS CERAMIC HOB OR AN OVEN WITH SUCH AN OPERATING DEVICE AND METHOD FOR OPERATING SUCH AN OPERATING DEVICE

(75) Inventor: Martin Baier, Ettlingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 532 days.

(21) Appl. No.: 11/745,761

(22) Filed: May 8, 2007

(65) Prior Publication Data

US 2007/0222749 A1  Sep. 27, 2007

Related U.S. Application Data

(63) Continuation of application No. PCT/EP2005/011900, filed on Nov. 8, 2005.

(30) Foreign Application Priority Data

Nov. 8, 2004  (DE) .......................... 10 2004 055 376

(51) Int. Cl.
*H05B 1/02* (2006.01)
*H05B 3/68* (2006.01)
(52) U.S. Cl. ..................................... 219/502; 219/446.1
(58) Field of Classification Search ............... 219/482, 219/487, 502, 443.1–468.2
See application file for complete search history.

(56) References Cited

U.S. PATENT DOCUMENTS

| 4,233,522 | A | 11/1980 | Grummer et al. |
| 4,837,430 | A | 6/1989 | Hasegawa |
| 6,198,080 | B1 * | 3/2001 | Rice et al. ...................... 219/506 |
| 6,218,967 | B1 | 4/2001 | Maula |
| 6,339,212 | B1 * | 1/2002 | Campbell .................. 219/460.1 |
| 2006/0066576 | A1 * | 3/2006 | Kong ............................ 345/168 |
| 2006/0152494 | A1 | 7/2006 | Liess |

FOREIGN PATENT DOCUMENTS

| DE | 36 11 358 A1 | 10/1987 |
| DE | 295 12 298 U1 | 9/1995 |
| DE | 197 00 836 C1 | 5/1998 |
| DE | 198 11 372 A1 | 9/1999 |

(Continued)

OTHER PUBLICATIONS

German Search Report corresponding to International Application No. PCT/EP2005/011900 dated Apr. 21, 2006.

(Continued)

*Primary Examiner* — Sang Y Paik
(74) *Attorney, Agent, or Firm* — Alston & Bird LLP

(57) ABSTRACT

An operating device and an electrical appliance provided with said operating device is disclosed. The electrical appliance comprises light barriers mounted on a frame that rests on a worktop. The light barriers can detect whether a finger is placed on one or more of the control panels for operation or controlling of said operating device or said electrical appliance. The control panels are arranged along one line in front of the light barriers. The control panels are provided at the top thereof with corresponding identifications, for example in the form of symbols. By moving the control panels away from the actual housing of the electrical appliance it is possible to provide larger heated surfaces for the cooking places.

26 Claims, 4 Drawing Sheets

FOREIGN PATENT DOCUMENTS

| | | |
|---|---|---|
| DE | 298 04 816 U1 | 9/1999 |
| DE | 100 47 920 A1 | 4/2002 |
| DE | 10120937 A1 | 10/2002 |
| EP | 0779712 A1 | 6/1997 |
| EP | 1158838 A2 | 11/2001 |
| FR | 2693859 | 1/1994 |
| WO | WO 97/30416 | 8/1997 |

OTHER PUBLICATIONS

German Search Report from German Application No. 10 2004 055 376.9.

* cited by examiner

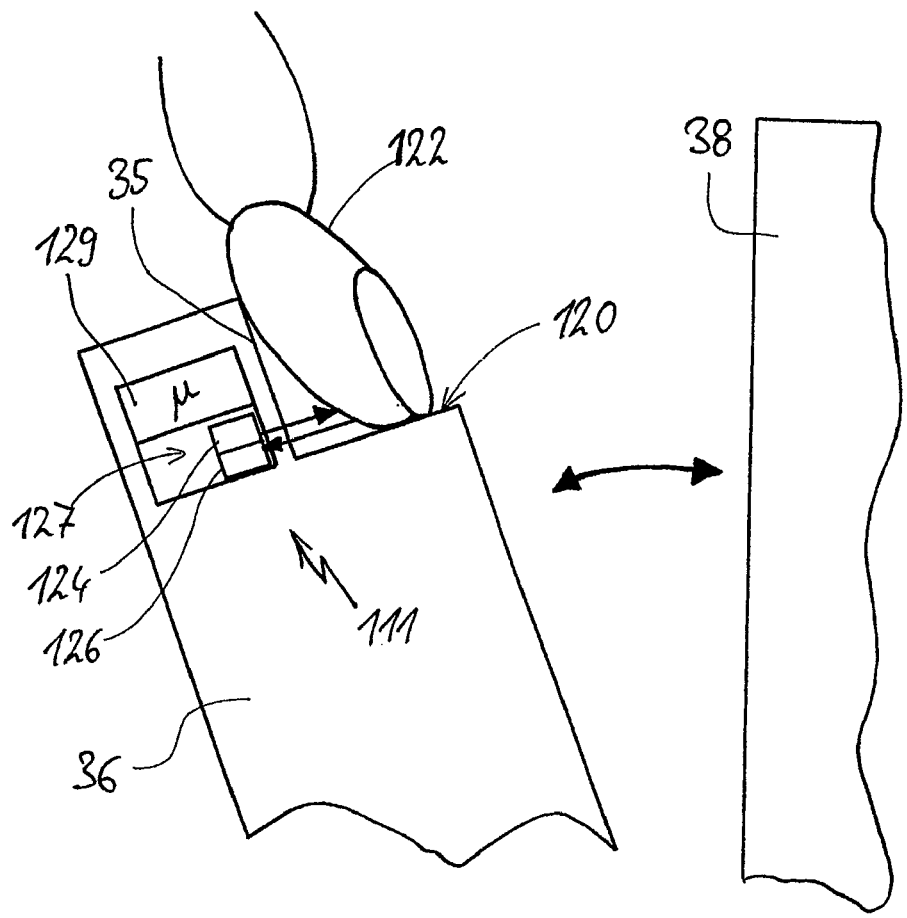
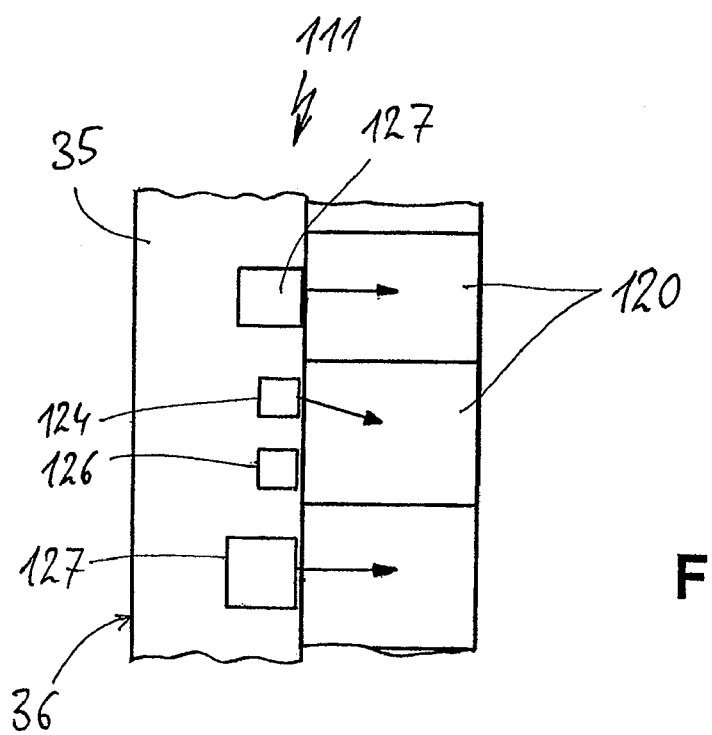
Fig.3
Fig.4

OPERATING DEVICE, ELECTRICAL APPLIANCE WITH SUCH AN OPERATING DEVICE, ARRANGEMENT OF A GLASS CERAMIC HOB OR AN OVEN WITH SUCH AN OPERATING DEVICE AND METHOD FOR OPERATING SUCH AN OPERATING DEVICE

RELATED APPLICATIONS

This application is a continuation of international patent application PCT/EP2005/011900, filed Nov. 8, 2005, which claims priority to German patent application 102004055376.9, filed on Nov. 8, 2004.

FIELD OF APPLICATION

The invention relates to an operating device, an electrical appliance with such an operating device, an arrangement of a glass ceramic hob or an oven with such an operating device and a method for operating such an operating device.

BACKGROUND OF INVENTION

So-called optical touch contact switches for glass ceramic hobs are known, for example, from DE 197 00 836 C1, which operate according to the reflected light barrier principle. Below a transparent glass ceramic plate is located such a reflected light barrier with a transmitter and a receiver. If over the same a finger is placed on the glass ceramic plate, light is reflected from the transmitter to the receiver and can be evaluated as an operation. This has proved satisfactory as an advantageous method, but only in the case of covers having the corresponding light transmittance or opening. However, it is disadvantageous that as a result of the arrangement there can only be a maximum of one touch contact switch per light barrier. This leads to relatively high costs, particularly if for certain control units, for example, for dishwashers or hobs, a larger number of touch contact switches is required.

It is also disadvantageous that the contact surface for the finger is located on the hob. This takes up space which in certain circumstances could be used for other purposes. There are also, in part, inhibitions by users against placing a finger on the hob, even if located at a cool point.

BRIEF DESCRIPTION OF THE DRAWINGS

Embodiments of the invention are diagrammatically shown in the drawings and are explained in greater detail hereinafter. In the drawings:

FIG. 3 illustrates a side view of a dishwasher door, in which a second variant of the invention operating device is installed in the door channel;

FIG. 4 illustrates a plan view of the operating device of FIG. 3;

DETAILED DISCUSSION OF THE INVENTION

Figure 1:
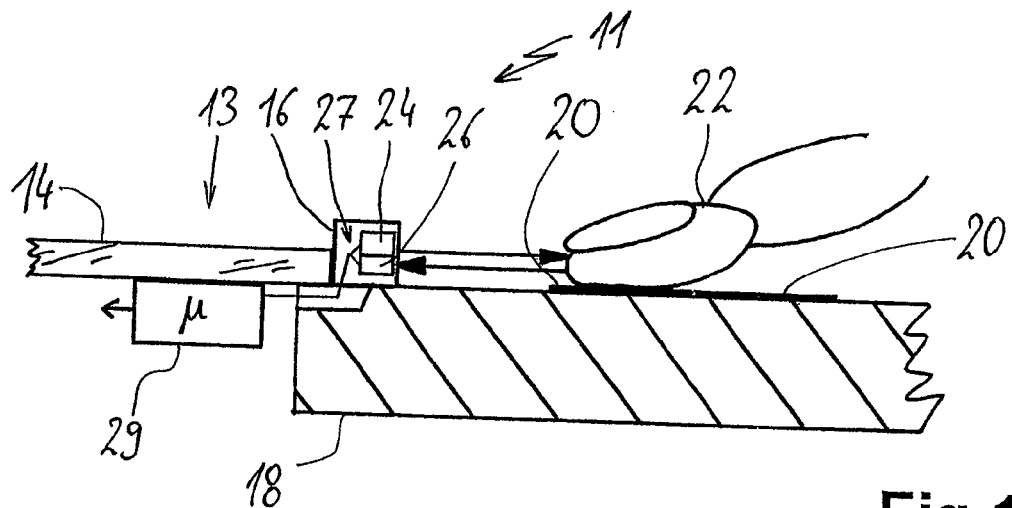
FIG. 1 illustrates a lateral section through an inventive operating device in the frame of a hob in a worktop.

One problem solved by the invention is to provide an aforementioned operating device, an electrical appliance with such an operating device, an arrangement of a glass ceramic hob in a worktop with such an operating device and a method for operating such an operating device enabling the prior art problems to be avoided and where several control panels can be controlled and evaluated with one optical measuring device or a reflected light barrier.

This problem can be solved in one embodiment by an operating device, an electrical appliance incorporating the operating device, an arrangement of a glass ceramic hob in a worktop with such an operating device, a baking oven having the operating device, or a method for operating such an operating device as claimed herein. Advantageous and preferred developments of the invention form the object of further claims and are explained in greater detail hereinafter. By express reference the wording of the claims is made into part of the content of the description.

Hereinafter the features of the aforementioned operating device, the electrical appliance, the arrangement and the operating method are described. These statements apply in the same way independently of one another for the operating device, electrical appliance, arrangement and operating method, even if some features are only mentioned once or with reference to one of these.

In the case of the operating device according to the invention, which as a type of reflected light barrier or triangulation measuring device has an optical measuring device with optical distance measurement and transmitter and receiver over and beyond a reflected light beam path, it is possible to determine with respect to the measuring device the distance of a finger or the like placed by an operator on the control panel for operating purposes. Several control panels arranged in a line, more particularly a straight line can be associated with the optical measuring device. The measuring device can, in each case, determine the distance from a control panel or the distance from an operation taking place thereon, for example, by placing a finger on the control panel. In place of an optical measuring device, it is equally advantageously possible to carry out a measurement with sound, particularly ultrasound. Therefore, reference is made hereinafter to a measuring device, but this also covers a device using acoustic distance measurement.

Thus, it is possible with a single optical or acoustic measuring device to evaluate several control panels or an operation taking place thereon. In this case the line of control panels is directed at the measuring device. By means of the distance measurement and with a known path to in each case one control panel it is possible to establish on which control panel an operation is taking place. This permits a reduction of costs for an evaluation of several control panels, because only one optical measuring device or reflected light barrier is required. Advantageously the line is a straight line.

In a further development of the invention, there is a second measuring device of the same type on the line or straight line with several control panels. The control panels are located between measuring devices. In this way with the measuring devices it is not only possible to determine the distance of the operation of a control panel from the measuring device, which for example, in the case of a very wide operating object, such as several fingers, in place of a single finger and therefore generally several control panels, a more reliable evaluation is permitted. Thus, if within the scope of the inventive method so-to-speak from both sides the location of the operation of a control panel is determined, it is also possible to determine the width of the finger or the operating object. Thus, if the finger is located over several control panels, an incorrect operation exists, which the operating device can detect as such and for example, emit a corresponding alarm message to the operator.

In an alternative implementation, it is possible for the line of control panels to have a distance from the measuring device and consequently runs past the same. In a further advantageous development, several measuring devices are juxtaposed and the line runs with equal spacing or parallel thereto. Preferably there are as many measuring devices as there are control panels.

In particularly preferred manner with respect to the first line of control panels is provided a second parallel line of further control panels. Thus, an operating device can be obtained, where several measuring devices are juxtaposed. A surface area of control panels is divided up in such a way that in front of the measuring devices or in front of each measuring device there are several control panels in a direction away from the measuring device. Simultaneously these control panels can run in a line parallel to the line of measuring devices. Importance is attached to the aspect of the possibility of associating several control panels with a single measuring device. By means of the distance measurement, it is once again possible to determine which of the control panels is being operated or on which is for example, placed a finger for operating purposes.

The path of the reflected light barriers can be parallel to the surface of the control panels. This makes it advantageously possible for the measuring devices not to have to be located below the surface on which the control panels are located. This for example, makes it possible to place the control panels on optically non-transparent surfaces, for example, of a metallic nature. Moreover, through this spacing between the measuring devices and the control panels an arrangement can be provided in which the control panels do not have to be physically connected to the operating device as an electrical appliance or part thereof. This is explained in greater detail hereinafter.

Lighting means can also be provided and identify a control panel for an operator. For this purpose they can illuminate or floodlight the control panel from the outside. Identification can either take place solely through illumination or also by projecting or producing certain symbols, which can also have different colours. This permits the indication of a different intended function of a control panel.

In an electrical appliance according to the invention, an aforementioned operating device can at least partly be provided on an edge or frame of a housing or a housing part. In a further development of the invention said operating device is at all times freely accessible. A frame of the electrical appliance can be constructed for the installation or arrangement in a surrounding installation surface, for example, a kitchen worktop, on which it is also possible to provide or produce the control panels. This could be is for example, a glass ceramic hob. With the aforementioned operating device in the edge or on the frame of the hob, the control panels can be located on a surface not belonging to the actual hob. Transmitters and receivers of the measuring devices can be located inside or below the edge or frame. By means of light guides, light deflecting means or the like the reflected light beam path can be passed outwards backwards and forwards to the control panels. Advantageously, there is a direction change of the radiation path, which is made possible by the light guides or light deflecting means.

In this way for example, a hob, particularly a glass ceramic hob, can be placed in a kitchen worktop. A line of control panels can run parallel to the hob edge or frame, for example, with a very limited distance therefrom, particularly a few centimeters. The control panels can be permanently and visibly indicated on the worktop, for example, by inscriptions, imprints, as well as by embossed or raised points. In a particularly advantageous manner there are several rows of control panels. In this way it is advantageously possible to place the necessary surface for the control panels alongside the edge instead of on the hob. Thus, it is advantageously possible in the case of a constant hob size to provide larger or more hotplate heaters. By varying the control panels provided and without any constructional modifications or changes to an identification of the hob, operating devices with further functions or control panels can be provided. A further advantage is that on moving the control panels away from the hob surface it is possible to eliminate a psychological inhibition of certain operators who now no longer need contact the hob for operating purposes. However, it is still possible for the operating device to be placed in the hob or electrical appliance, which reduces installation costs.

As an alternative to such an electrical appliance in the form of for example, a hob or a corresponding arrangement, it is possible to provide an electrical appliance with a movable cover or door. In the edge thereof is provided the operating device, for example, in a front face or a door groove or channel of the cover or door. Particularly in the case of dishwashers this represents an advantageous design, because it is normal to provide the operating devices in the door channel. If these are now given the aforementioned optical design, mechanical pushbuttons and the associated sealing problems and the like can be avoided.

It is for example, possible here to provide two optical measuring devices in the frame or channel of a door with a large mutual spacing. Between the same control panels can be arranged in a line, so that all the measuring devices and control panels are in a line. If the measuring devices are for example, located on opposite corners or ends of one side of the door or cover, it is possible to utilize all the area between them for control panels. Generally an adequate operating possibility is created from the resulting number of control panels. The measuring devices can be provided in projections or projecting parts, directed away from the frame or raised above the same. This projection can amount to a few centimeters, for example, approximately three centimeters.

In a method according to the invention, an evaluation can either take place for control panels located on a line on which are also located the corresponding measuring devices. Then, and as described hereinbefore, advantageously from both sides the distance to the operating location is measured. In this way, its width or spatial extension can be determined. If this coincides with the width and position of the possible associated control panel, the operation thereof can be detected and evaluated as such.

In a method for operating an operating device, in which several measuring devices are juxtaposed and the associated control panels are located on lines away from the same and in particular parallel to one another, the transmitters can alternately emit light beams and the adjacent receivers can in each case receive the emitted light. Advantageously, the transmitters are controlled in offset or multiplex operation, so that they do not interfere with one another. In a particularly advantageous manner, one transmitter and one receiver is in each case associated with a control panel or a row of control panels. These form the measuring device, which can exclusively evaluate the associated control panels. By measuring the distance to a point of operation or reflection of the light beams, it is possible to determine which of the control panels in front of it has been operated.

In an alternative development, the receiver can in each case be placed in front of each row of control panels. The transmitters can be provided at a random location, but in particular between the control panels. In an evaluating method, it is possible to determine at which receiver the reflected back signal with the highest intensity is present and from this can in each case be established an operated control panel.

As an alternative to a multiplex operation, the transmitters can emit coded light signals in the case of simultaneous operation. This also makes it possible for transmitters to determine in the case of a received, reflected light signal, the transmitter from which it emanates.

In a simple variant through geometrical arrangement or possible light guidance or covering, precise associations can be created between the measuring devices and control panels, which render impossible an erroneous evaluation.

These and further features can be gathered from the claims, description and drawings and the individual features, both singly or in the form of subcombinations, can be implemented in an embodiment of the invention and in other fields and can represent advantageous, independently protectable constructions for which protection is claimed here. The subdivision of the application into individual sections and the subheadings in no way restrict the general validity of the statements made thereunder.

FIG. 1 shows a first variant of an arrangement 11 according to the invention, in which a glass ceramic hob 13 comprising glass ceramic plate 14 and frame 16 is inserted in a corresponding cutout of a worktop 18. On said worktop 18 are placed several control panels 20 in a juxtaposed double row, as can be gathered by comparison with FIG. 2. A finger 22 is for example, placed on one of the control panels and is intended to represent the operation thereof.

On their top surface the control panels 20 for example, carry symbols 21, which can for example, be in the form of plus or minus symbols. Such printed-on symbols 21 are considered advantageous, because together with the control panels 20 they only have to be applied to the existing worktop 18, for example, by adhesion, pressing on or the like. The function of the control panels 20 is here solely to indicate a particular location where a finger 22 is to be applied for operating purposes, for example, Further functionalities are not absolutely necessary.

The frame 16, which can be made hollow in roughly the same way as a housing, contains transmitters 24 and receivers 26, which belong together and form a type of reflected light barrier 27. As is apparent from the subsequent drawings, they can be constructed as a module or alternatively as individual components. Transmitters 24 and receivers 26 or reflected light barrier 27 are connected in signal-transmitting manner to a control unit 29, which is in particular placed below the glass ceramic plate 14. Control unit 29 can also be constructed for the other functions of the glass ceramic hob 13 or at least takes over all the operation-related functions. The signal-transmitting connection can take place by cable, in the shown manner and then, in certain circumstances, a cutout is provided in worktop 18. Alternatively, the arrangement 11 or installation of the glass ceramic hob 13 in worktop 18 can be such that a portion of the frame with a signal-guiding line or connection is located within the cutout in the worktop. It is also possible to construct a signal-transmitting connection in cableless manner or to use radio or a light or IR connection.

Figure 2:
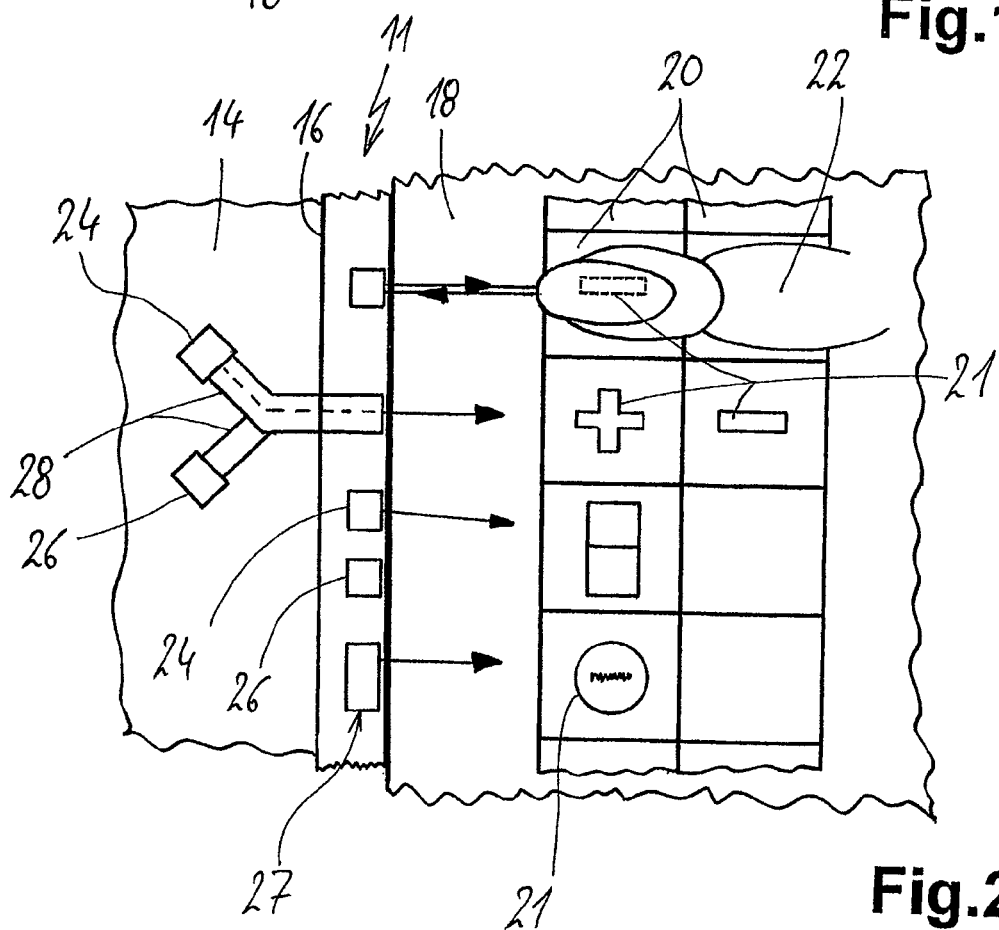
FIG. 2 illustrates a plan view of the operating device of FIG. 1.

The plan view of FIG. 2 shows how the control panels 20 form a double row on the worktop 18 and there can even be several rows. With each control panel 20 or each column of control panels 20 in the direction away from the light barriers 27 can be associated precisely one light barrier. The orientation of transmitters 24 and receivers 26 or the light barrier path is such that it either, as represented by the top light barrier in FIG. 2, there is a particularly close juxtapositioning through for example, superimposed transmitters and receivers. Thus, no significant part is played by a greater distance of a finger 22 from light barrier 27. In the arrangements below, the situation is such that the transmitters 24 and receivers 26 are juxtaposed either singly or in a module. This, inter alia permits a shallower construction of frame 16, which can be advantageous. The light beams of transmitter 24 and the receiving means of receiver 26 can be set up for different angles with which light can be emitted and received.

FIG. 2 also shows a variant in which transmitters 24 and receivers 26 are located behind and not in frame 16 or are located below the glass ceramic plate 14. By means of light guides 28, in the same way as with the other transmitters and receivers, the light is guided to the edge of frame 16 and/or captured there. Such an arrangement has the advantage that the components of transmitters and receivers are positioned behind or beneath frame 16 instead of within the same, for example, where the remaining control unit is located. It is also conceivable to reduce the height of frame 16.

It is possible for part of the light barriers 27 to be located more towards the underside or below the frame 16. Thus, the light barriers or their components in part engage in worktop 18, which should have corresponding recesses.

At certain points frame 16 is made correspondingly transparent for the light beams, either with openings or with windows. Windows have the particular advantage that in a sealed version they prevent liquid, which can in particular be present during cooking or cleaning, to penetrate the interior of hob 13.

FIG. 3 shows an arrangement 111 based on the same principle, but using a different electrical appliance. In the channel or groove 35 of a door 36 of a dishwasher 38 is provided an operating device with a row of juxtaposed control panels 120. In the projecting shoulder of door channel 35, which projects over control panels 120, are located reflected light barriers 127 comprising transmitters 124 and receivers 126. There is also a corresponding control unit 129, which is connected to light barriers 127. The arrangements, particularly also different constructions of the light barriers similar to FIG. 2, can be gathered from FIG. 4. Advantageously, contact does not have to take place directly with the surface in front of the sensor and instead there can be a certain distance therefrom.

In door channel 35 there are once again corresponding transparent areas, particularly using windows. This has the particular advantage that with an electrical appliance such as a dishwasher 38, the problem with moisture in the interior or on the arrangement 111 of the control device can be avoided as compared with mechanical pushbuttons generally requiring openings. Most other touch contact switches for example, having a capacitive basis would also not function properly in such a case, because especially touch switches can be interfered with by the presence of moisture.

Figure 5:
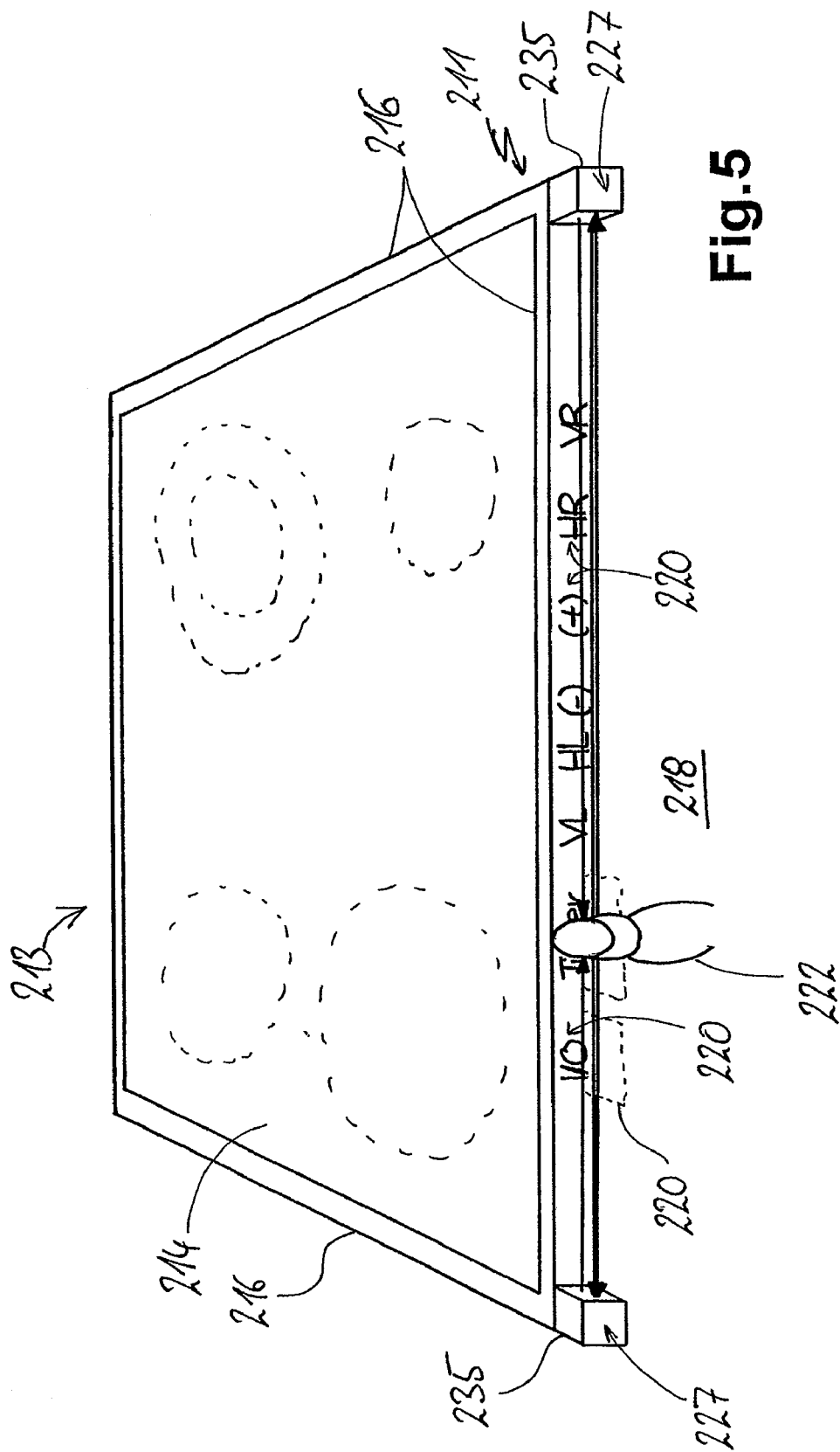
FIG. 5 illustrates an inclined view of a installed hob, in whose front frame is installed a third variant of an inventive operating device.

FIG. 5 finally shows another construction of an inventive arrangement 211 with a hob 213 and glass ceramic plate 214. Frame 216 of hob 213 has a normal construction or corresponds to a conventional, circumferential frame. On the left and right front corners are provided projections 235, which project over the front or front part of frame 216 and for example, rest on a worktop or the like. On the front side of frame 216 are provided at a number of locations control panels 220 and these are indicated by various inscriptions, such as I/O, timer, VL, HL, etc., corresponding to symbols 21 in FIG. 2. The application of a finger 222 on one of said control panels 220 is intended to represent or initiate an operation. Instead of being located on frame 216, the control panels can be on areas of worktop 218 in front of the same, as indicated on the left-hand side by the broken line.

Figure 6:
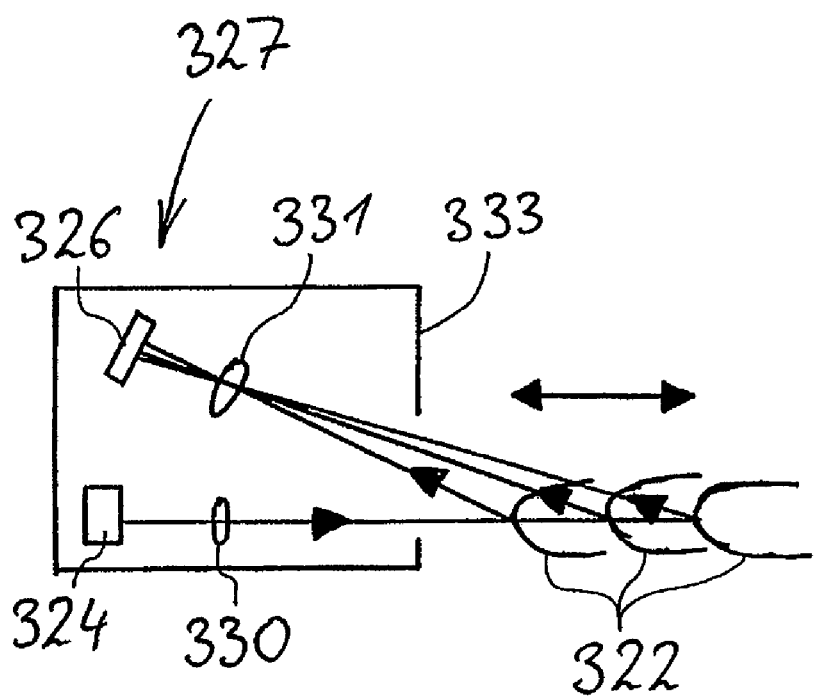
FIG. 6 illustrates an alternative construction of a distance measurement arrangement using triangulation.

The projections 235 contain optical distance measuring devices 227, which so as not to overburden representation are not shown in detail here. They advantageously operate with laser triangulation, as shown in FIG. 6. This means that an object to be measured is obliquely floodlit with a light beam and as a function of its distance from the floodlighting point the light is reflected obliquely with a different angle. This reflected light is focussed by a specific receiver, optionally accompanied by the series connection of a positive lens and is projected onto a flat light receiver. As a function of the impact point of the reflect light beam conclusions can be drawn concerning the angular relationships and therefore relatively precisely regarding the distance of the object to be measured. This method can be easily implemented by the expert and constitutes a good alternative to the above-mentioned distance measurement using a transmit time measurement. Both methods can be used in the drawings without giving preference to one or the other and without giving a particular emphasis.

Thus, the distance measuring devices can be constructed for example, according to FIG. 1. This also applies to their signal-transmitting connection to a control unit of hob 213 or the like.

As indicated by the arrows from the transmitters and the reflected light paths, by measuring the distance of the finger 222 from the left-hand projection 235 and from the right-hand projection 235, it is possible to determine the precise position and also the width of the finger on the control panels 220. It is easily possible to determine therefrom on which control panel 220 the finger 222 is applied and therefore which control panel has been selected. With such an arrangement 211 according to FIG. 5, other than in the previous arrangements, only a single row of control panels along a line can be evaluated. If on the basis of this principle several juxtaposed rows of control panels are to be evaluated, then the projections 235 should be made somewhat longer and there should be two light barriers for each row. It is also possible to represent the control panels 220 not only on the front side of frame 216, but optionally on the areas of the underlying worktop 218 in front of it, as shown in broken line form. This can roughly correspond to the arrangement of FIGS. 1 and 2. The symbols 221 on control panels 220 shown in FIG. 5 can be implemented alternatively to a printing or fixed representation by underlying variable displays or the like. In this way it is for example, possible to create a type of context-dependent operating device.

One of the advantages of an arrangement for example, according to FIGS. 1 and 2 is that as a result of the moving away of the control panels 20 the appliance or hob 13 can be made smaller or more or larger hotplates can be provided. The light barriers are designed for evaluating several rows of control panels. Corresponding functionalities can subsequently generally be carried out by means of software changes to the control unit. Through a relatively easy replacement of the symbols 21 or the indications of the control panels 20, a hob 13 can be subsequently extended or upgraded without it being necessary in complicated manner to intervene within the appliance or carry out structural changes.

FIG. 6 shows a triangulation-based arrangement 327. A transmitter 324, advantageously a laser emitter or a laser diode, emits light, optionally through the optics 300 in front of it and said light beam strikes a finger 322. The latter reflects it and by means of a lens 331 it is projected onto receiver 326. Lens 331 is used for producing a sharply defined light spot on the receiver. It can be seen that as a function of the distance of the finger from arrangement 327 the light beam impact point on receiver 326 changes its position as a consequence of the different angle between the emitted and reflected beam. This lateral displacement of the light spot on receiver 326 can be detected and evaluated as a different distance, which permits a surprising degree of precision.

The receiver can advantageously be a PSD (Position Sensing Device) or a CCD (Charge Coupled Device). In particular, they can be constructed in line or row form, so that the lateral displacement of the light spot can be measured particularly well and accurately.

The invention claimed is:

1. An operating device for an electrical domestic appliance said operating device having a plurality of non-movable control panels linearly arranged along a first line and a plurality of respective optical measuring devices configured for measuring a position of a finger of an operator applied onto a respective one of the plurality of control panels, each said optical-measuring device having a transmitter configured for transmitting a beam perpendicular to said first line to said finger on said control panel and having a receiver for receiving a reflected beam reflected by said finger, wherein said transmitter and said receiver are positioned so that the first line passes through said transmitter and said receiver, wherein further said operating device is configured to evaluate said position of said finger when applied onto the one of the plurality of control panels for determining an operation of said domestic appliance.

2. The operating device according to claim 1 further comprising a second plurality of control panels aligned along a second line, wherein the first line and second line are parallel to each other.

3. The operating device according to claim 1 wherein the reflected beam is a reflected light beam parallel to a surface of said plurality of control panels.

4. The operating device according to claim 1, further comprising a light source illuminating one of said plurality of control panels.

5. An operating device for an electrical domestic appliance said operating device having a plurality of non-movable control panels linearly arranged along a first line and a plurality of respective optical measuring devices configured for measuring a position of a finger of an operator applied onto a respective one of the plurality of control panels, each said optical measuring device having a transmitter configured for transmitting a beam perpendicular to said first line to said finger on said control panel and having a receiver for receiving a reflected beam reflected by said finger, wherein said transmitter and said receiver are positioned so that the first line is positioned in front of said transmitter and said receiver, wherein further said operating device is configured to evaluate said position of said finger when applied onto the one of the plurality of control panels for determining an operation of said domestic appliance.

6. The operating device according to claim 5, wherein a plurality of said measuring devices are juxtaposed to each other and aligned to a second line wherein the second line is parallel to said first line.

7. The operating device according to claim 6, further comprising a plurality of measuring devices, the number of which is the same as a number of said plurality of control panels along said line, wherein said plurality of control panels are equidistantly spaced with respect to said first line.

8. The operating device according to claim 5, wherein each one of said plurality of control panels is respectively aligned in front of each one of said plurality of measuring devices.

9. The operating device according to claim 5 further comprising a second plurality of control panels aligned along a second line, wherein the first line and second line are parallel to each other.

10. The operating device according to claim 5 wherein the reflected beam is a reflected light beam parallel to a surface of said plurality of control panels.

11. The operating device according to claim 5, further comprising a light source illuminating one of said plurality of control panels.

12. An electrical domestic appliance comprising:
an operating device having a plurality of non-movable control panels linearly arranged along a first line and a plurality of respective optical measuring devices configured for measuring a position of a finger of an operator applied onto said control panel, each said measuring device having a transmitter for transmitting a beam perpendicular to said first line to said finger on one of said plurality of control panels and having a receiver for receiving a reflected beam reflected by said finger, wherein said operative device is configured to evaluate said position of said finger on said one of said plurality of control panels as a user input for operating said domestic appliance; and
a housing having an edge or frame, on which said operating device is located wherein said first line is parallel to said edge or frame.

13. The electrical appliance of claim 12 wherein the operating device is accessible by finger of a user, wherein said edge or frame is constructed for installation on a mounting surface surrounding or adjacent to said electrical appliance and wherein said at least one control panel is provided on said mounting surface.

14. The electrical appliance according to claim 13, wherein said electrical appliance is a baking oven with a panel for said operating device and said measurement device is an optical measurement device.

15. The electrical appliance according to claim 13, further comprising a second measuring device wherein said measuring device and said second measuring device are provided in said frame as optical measuring devices and wherein a plurality of control panels are linearly positioned between said measuring devices.

16. The electrical appliance according to claim 15, wherein said measuring device and said second measuring device are located at opposite ends of one side of said frame.

17. The electrical appliance according to claim 12, wherein said measurement device is an optical device and further, wherein said transmitter and said receiver are placed inside or below said edge or frame with light guides directing light outwards to said control panels.

18. The electrical appliance according to claim 17, wherein there is a change of the direction of said light beam path direction between said transmitter and said receiver.

19. The electrical appliance according to claim 12, further comprising a movable door wherein said operating device is provided in said edge or said frame of said movable door.

20. The electrical appliance according to claim 19, wherein said operating device is provided in an end face or a door channel of said movable door.

21. The electrical appliance according to claim 19, wherein said electrical appliance is a dishwasher.

22. An arrangement of a glass ceramic hob with a frame in a worktop, said frame having an operating device comprising a plurality of non-movable control panels and a plurality of respective optical measuring devices for measuring a position of a finger of an operator applied onto one of said plurality of control panels, each said optical measuring device having a transmitter configured for transmitting a beam to said finger on said one of said plurality of control panels and having a receiver configured for receiving a reflected beam being reflected by said finger, wherein said operative device is configured to evaluate said position of said finger on said one of said plurality of control panels as an operation of said domestic appliance,
wherein said plurality of control panels are linearly arranged in a line adjacent to an area of said worktop towards said glass ceramic hob.

23. The arrangement of a glass ceramic hob according to claim 22, wherein said line of said plurality of control panels is parallel to said frame, wherein further a distance from each one of said plurality of control panels to said frame is less than 3 centimeters.

24. The arrangement of a glass ceramic hob according to claim 22, wherein said measuring device is positioned below said glass ceramic hob, wherein said glass ceramic hob has a housing and said measuring device is also positioned in said housing adjacent to said hob frame, wherein further said control panels are located alongside said hob frame.

25. The arrangement of a glass ceramic hob according to claim 22, wherein said plurality of control panels are permanently and visibly identified on said worktop.

26. An arrangement of a baking oven with a projection, wherein said projection comprises an operating device having a plurality of non-movable control panels and a plurality of respective optical measuring devices for measuring a position of a finger of an operator applied onto said one of said plurality of control panels, said optical measuring device having a transmitter for transmitting a beam to said finger on said control panel and a receiver for receiving a reflected beam being reflected by said finger, wherein said operative device is configured to evaluate said position of said finger on said one of said plurality of control panels as an operation of said domestic appliance, wherein further said plurality of control panels of said operating device are linearly arranged on at least one line on an area adjacent of said oven.

* * * * *